United States Patent [19]

Ertl

[11] Patent Number: 4,498,232

[45] Date of Patent: Feb. 12, 1985

[54] AUTOMATIC INSERTION AND REMOVAL DEVICE FOR COMPONENTS

[75] Inventor: Wilhelm Ertl, Ottobrunn, Fed. Rep. of Germany

[73] Assignee: Siemens Aktiengesellschaft, Berlin and Munich, Fed. Rep. of Germany

[21] Appl. No.: 374,286

[22] Filed: May 3, 1982

[30] Foreign Application Priority Data

May 18, 1981 [DE] Fed. Rep. of Germany ....... 3119686

[51] Int. Cl.³ .............................................. H05K 3/30
[52] U.S. Cl. ........................................ 29/741; 29/593; 29/762; 29/837; 209/574; 324/73 AT; 324/158 F
[58] Field of Search ................. 29/762, 764, 741, 593, 29/832, 837, 838; 209/573, 574; 324/158 F, 73 AT

[56] References Cited

U.S. PATENT DOCUMENTS

| | | | |
|---|---|---|---|
| 3,104,760 | 9/1963 | Monahan | 209/573 |
| 4,215,468 | 8/1980 | Greco | 29/764 |
| 4,234,418 | 11/1980 | Buissicat | 29/593 X |

Primary Examiner—Carl E. Hall
Attorney, Agent, or Firm—Herbert L. Lerner; Laurence A. Greenberg

[57] ABSTRACT

Automatic insertion and removal device for components, including a supply container for the components, a holding device for the components, an insertion head for taking the components from the supply container and inserting the components into the holding device, a removal head for removing the components from the holding device and for passing the components on, and a cam control connected to the heads for providing a motion cycle for the heads.

11 Claims, 8 Drawing Figures

AUTOMATIC INSERTION AND REMOVAL DEVICE FOR COMPONENTS

The invention relates to an automatic insertion and removal device for components and in particular, integrated circuits.

Automatic insertion machines for assembling components such as resistors, capacitors, discrete semiconductors or integrated circuits to circuit boards, are known. These automatic machines operate pneumatically as a rule and can only insert components into circuit boards, but not remove them.

For testing integrated circuits for operability, computer-controlled test equipment is generally used. A test card plate fitted to the specific circuit type to be tested can be connected to the test equipment. Since only short test line lengths can be used for testing components with short access times, the test cards can as a rule be disposed directly on the test equipment. The circuits to be tested are inserted by hand into measuring sockets located in the test card plates and are sorted by hand after the measurement, depending on the test result. This procedure requires a great deal of time and therefore leads to poor utilization of the test equipment. When inserting circuits, especially if they are provided with numerous contact pins such as ICs with pins disposed in two rows (dual in-line package), the insertion and removal of the integrated circuits into and out of the measuring socket can lead to bending of the contact pins and therefore to problems with the later insertion of this circuit into a circuit board. Manual sorting of the tested ICs can also lead to errors, such as by interchanging.

It is accordingly an object of the invention to provide an automatic insertion and removal device for components, which overcomes the hereinafore-mentioned disadvantages of the heretofore-known devices of this general type, and which can be put on one of the above-described manual test stations without the necessity of intervening electrically or mechanically as far as the manual test station is concerned.

With the foregoing and other objects in view there is provided, in accordance with the invention, an automatic insertion and removal device for components, comprising a supply container for the components, a holding device for the components, an insertion head for taking the components from the supply container and inserting the components into the holding device, a removal head for removing the components from the holding device and for passing the components on, and a cam control connected to the heads for providing a motion cycle for the heads. In this manner it is possible to provide a compact automatic insertion and removal machine which can be driven by a continously running motor, which works reliably and precisely, and with which short cycle times can be realized in accordance with the short measuring times of commercially available automatic testers.

In accordance with another feature of the invention, the cam control includes a common shaft, cams disposed on the shaft, and a motor for driving the shaft.

In accordance with a further feature of the invention, the heads include pliers or tweezers facing a component for gripping the component.

In accordance with an added feature of the invention, the cam control includes opening cams, opening levers being actuatable by the opening cams and opening push rods being actuatable by the opening levers, and each of the heads includes pliers on its side facing a component, the pliers being actuatable by the opening push rods for gripping the component.

In accordance with an additional feature of the invention, the cam control includes height-positioning cams, height-positioning levers being actuatable by the height-positioning cams and height-positioning push rods being actuatable by the height-positioning levers for adjusting the pliers in height relative to their distance from the holding device.

In accordance with again another feature of the invention, the holding device is disposed in a given plane, and the cam control includes plier-rotating cams, plier-rotating levers being actuatable by the plier-rotating cams and plier-rotating push rods being actuatable by the plier-rotating levers for rotating the pliers at least in the given plane.

In accordance with again a further feature of the invention, the pliers are rotatable in a plane perpendicular to the given plane in which the holding device is disposed.

In accordance with again an added feature of the invention, the pliers are movable in a plane parallel to the given plane in which the holding device is disposed.

In accordance with again an additional feature of the invention, the pliers for gripping the components each include two plier jaws, a spring connected to the jaws for urging the jaws together, a cone being insertable between the jaws for pushing the jaws apart, and a transmission lever being actuatable by the opening push rod for pushing the cone between the jaws.

In accordance with yet another feature of the invention, there is provided a plate having a coulisse and being connected to the pliers, the height-positioning push rods being engageable with the coulisse.

In accordance with yet a further feature of the invention, there is provided a key shaft connected between the pliers and the coulisse engageable by the height-positioning push rod.

In accordance with a concomitant feature of the invention, the plier-rotating push rod has a rack formed in a side thereof, and including at least one key shaft connected to at least one of the heads and a gear connected to the key shaft, the gear being rotatable by the rack.

Other features which are considered as characteristic for the invention are set forth in the appended claims.

Although the invention is illustrated and described herein as embodied in an automatic insertion and removal device for components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
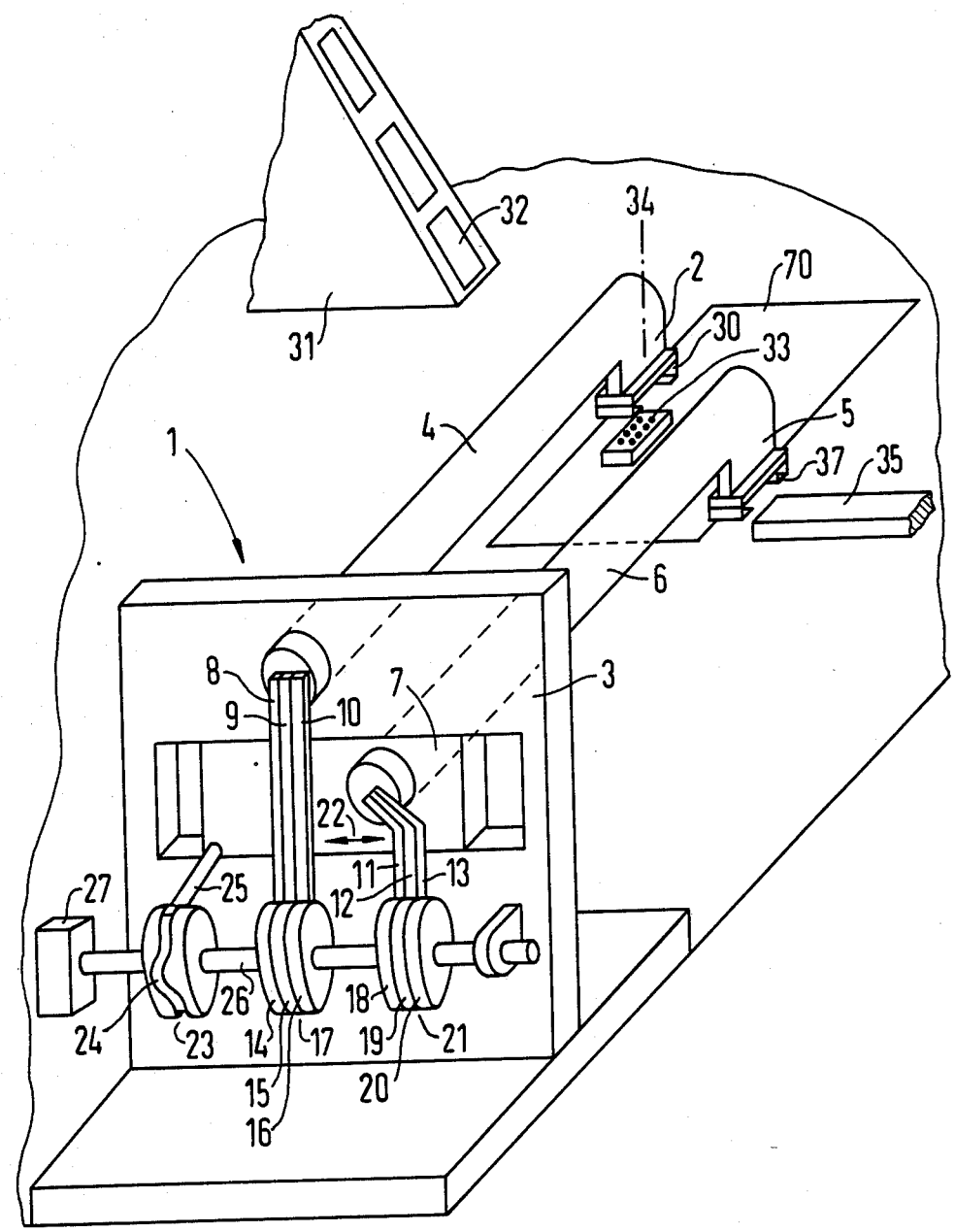
FIG. 1 is a fragmentary, diagrammatic, perspective view of an automatic machine according to the invention, which should be considered as an embodiment example.

Referring now to the figures of the drawing and first particularly to FIG. 1 thereof, there is seen a simplified diagrammatic representation of an embodiment example of an automatic inserting and removing device 1 according to the invention, having an insertion head 2 which is disposed at one end of a support tube 4 fixed in a metal frame 3. A removal head 5 is similarly disposed at a second support tube 6 which is held in a slider 7. Disposed in the support tubes 4 and 6 are push rods which are not shown in FIG. 1 for reasons of greater clarity. The push rods can be actuated by means of levers 8, 9, 10 and 11, 12, 13, respectively, which are disposed at the ends of the support tubes 4, 6 opposite the heads 2, 5. The levers can be moved by means of cams. The three levers 8 to 10 are actuated by three cams 14, 15, 16 which are combined in a cam set 17, while the levers 11 to 13 are actuated by cams 18 to 20 which are combined in a second cam set 21. For shifting the slider 7 holding the support tube 6 (according to the arrow 22) parallel to the axis of the support tube, a further set of cams 23 is provided which has a coulisse 24 that is engaged by a rolling bearing 25 rigidly connected to the slider 7. Through the cam set 23, the support tube 4 and therefore the insertion head 2 as well, can be rotated about its axis by means of a mechanism which is not shown in FIG. 1 for reasons of greater clarity.

The three cam sets 17, 21 and 23 are disposed on a common key shaft 26 which can be driven by a motor 27. While the cam sets 17 and 23 are rigidly connected to the key shaft, the cam set 21 can be moved on the key shaft 26 in accordance with the shifting of the slider 7.

The frame 3 which holds the device 1 is located for adjustable displacement on a cross slide which can be moved in the x and y- direction and vertically, but is not shown in the drawing.

The automatic inserting and removal device according to the invention operates in such a way that by means of the pliers 30 disposed at the end of the insertion head 2, a component 32 is seized and picked up at the end face thereof from a supply container 31. The component may, for instance, be an integrated circuit with a dual-in-line housing. If desired, the pliers 30 are at the same time rotated 90° about the axis 34 of the inserting head 2, and subsequently the pliers 30 are lowered so that the component 32 is inserted into a socket or holding device 33 which is disposed on a measuring board 70. Then, the pliers 30 are moved again in the direction toward the supply container 31 for gripping the next component 32. After the measurement of the component 32 is completed, the component is grabbed by means of pliers 37 which are disposed at the lower end of the removal head 5, and the component is pulled out of the socket 33 by pulling the pliers 37 upward. By means of a parallel shift of the support tube 6 in the direction of the arrow 22, the insertion of the next component into the socket 33 is made possible. This is done, on one hand, by means of the pliers 30, and on the other hand, the component in the pliers 37 is conducted over a track 35 and is deposited on the track 35 after the pliers 37 are lowered and opened. The measured component can be passed on along the track 35 and conducted, such as for sorting purposes, to a turntable which is connected to several other tracks, depending on the quality steps provided.

Figure 2:
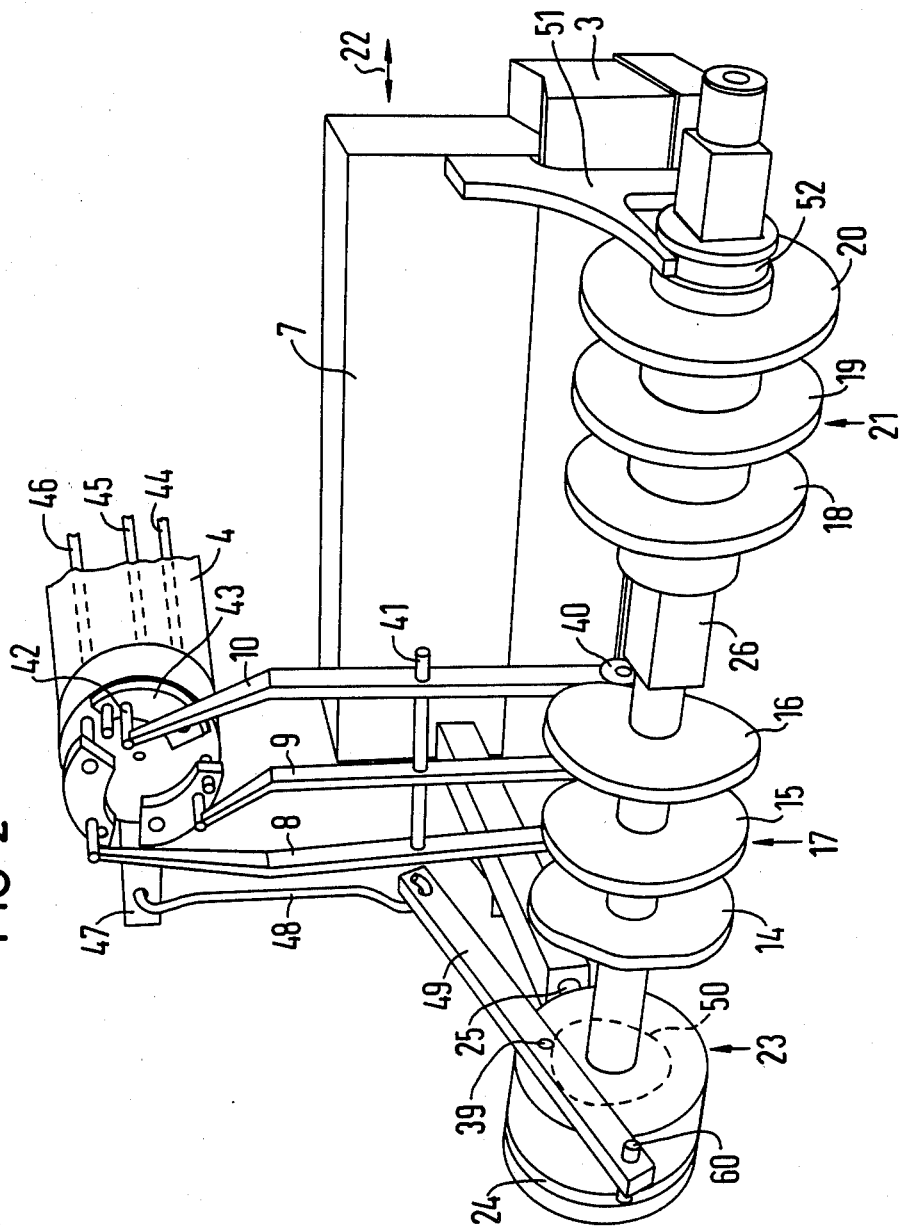
FIG. 2 is a fragmentary perspective view of an embodiment example for a cam control applicable to the automatic machine according to the invention.

FIG. 2 shows an embodiment example of a cam and lever arrangement provided in the automatic insertion and removal machine according to the invention, for actuating the insertion head 2 and the removal head 5. Corresponding to FIG. 1, like parts are designated with the same reference symbols. Three sets of cams 23, 17 and 21 are disposed on the key shaft 26. The three cams 14, 15, 16 of the cam set 17 actuate the levers 8, 9, 10 necessary for moving the pliers 30 of the insertion head 2. The levers 8, 9, 10 can rotate about a fixed or mass point formed by the rod 41 which is rigidly connected to the frame 3. The rotation is made possible by the shape of the cams 14, 15, 16 which, deviating from circular symmetry, actuate the levers 8, 9, 10 through roller bearings 40 to reduce the friction in a manner which is known per se. The ends of the levers 8, 9, 10 are connected by adjusting screws 42 to pressure plates 43 which are rigidly connected to the push rods 44, 45, 46 required for actuating the insertion head. Thus, by rotating the height-positioning cam 14, the height-positioning lever 8 can be moved, which moves the height-positioning push rod 46 along the axis of the support tube 4; by rotating the opener cam 15, the opener push rod 44 can be moved by the opening lever 9; while the plier-rotating push rod 45 can be moved by rotating the plier-rotating cam 16 by the plier-rotation lever 10. The levers 8, 9, 10 are acted upon resiliently in such a manner that the roller bearings 40 rest against the cams 14, 15, 16.

The support tube 4 or an inner tube which is disposed inside the support tube 4 but is not shown in the figure, can be rotated about the axis of the support tube 4 by, say, 60°, by means of a lever 47. To this end, the lever 47 is connected by means of a connecting rod 48 to one end of a further lever 49, the other end of which is connected at a fixed point 60 to the frame 3 and is provided in its center region with a rolling off point 39 which rolls off on a cam 50 belonging to the cam set 23.

The cams 18, 19, 20 belonging to the cam set 21 act on the levers 11, 12, 13 which serve for actuating the removal head 5, but these are not shown in the diagrammatic presentation of FIG. 2 for reasons of clarity. These act in a way corresponding to the levers 8, 9, 10 and push rods 44, 45, 46 provided for actuating the insertion head 2. Contrary to the cam sets 17 and 23, which are rigidly disposed on the shaft 26, the cam set 21 can be moved axially relative to the shaft 26. The displacement in the direction of the arrow 22 is accomplished by providing that in the cam set 23 a cam having a coulisse 24 is provided, with which a roller bearing 25 rigidly connected to the slider 7 is engaged. The slider 7 is in turn rigidly connected to an angle bracket 51 which engages in a slot 52 formed at the cam set 21 for displacing the cam set 21. The cam set 21 is displaced axially on the key shaft 26 corresponding to the shape of the curve of the coulisse 24.

The individual motion cycles of the heads 2 and 5 can be controlled mechanically as shown, for instance, in FIGS. 3 to 7. The mechanism shown in FIG. 3 serves for vertical displacement (in the arrow direction 56) of the inserting head 2 and the removal head 5, respectively. The height-positioning cam 14 actuates the adjusting level 8 which has a fixed point (fulcrum) 41, and a roller bearing 40. The height-positioning lever 8 moves the push rod 46 which is contained in the support tube 4 in the longitudinal direction by way of the adjusting screw 42. The push rod 46 terminates by means of a ball bearing 55 in a coulisse (or window) 54 formed in a plate 53 according to an inclined plane. The inserting head 2 is rigidly connected to the plate 53. Upon a movement of the height-positioning push rod 46 to the right, the inserting head 2 therefore moves upward, while upon a movement of the height-positioning push rod 46 to the left it moves downward. The devices necessary for guiding the arrangement are not shown in FIG. 3 and the other figures for reasons of clarity.

A corresponding mechanical arrangement is provided for the height adjustment of the removal head 3.

Figure 3:
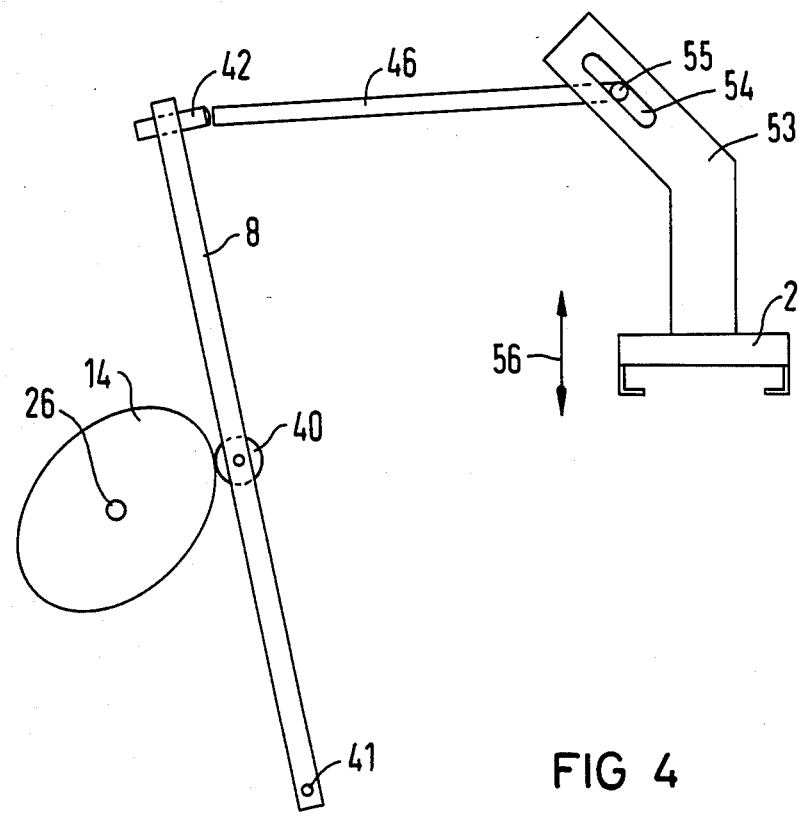
FIGS. 3 to 7 are fragmentary views of embodiment examples for the mechanical execution of three motion cycles of an insertion or removal head.
Figure 4:
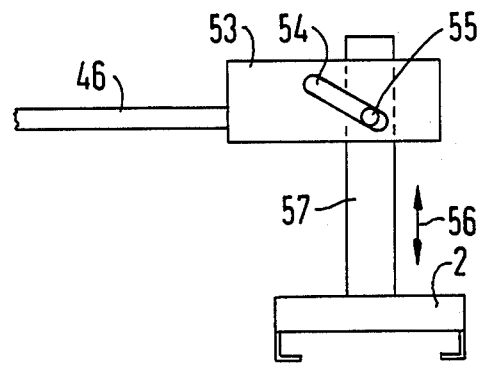

A height positioning device which can be used alternatively to the mechanism shown in FIG. 3 is shown in FIG. 4. In FIG. 4, the end of the push rod 46 at which the inserting head 2 is located, is connected rigidly to the plate 53.

In the plate 53 there is again formed a coulisse 54 according to an inclined plane. A ball bearing 55 disposed on the key shaft 57 engages the coulisse 54. At the lower end of the key shaft 57, is the inserting head 2, and the key shaft 57 has a hole formed therein for receiving a pressure pin 65, which will be described below.

Figure 5:
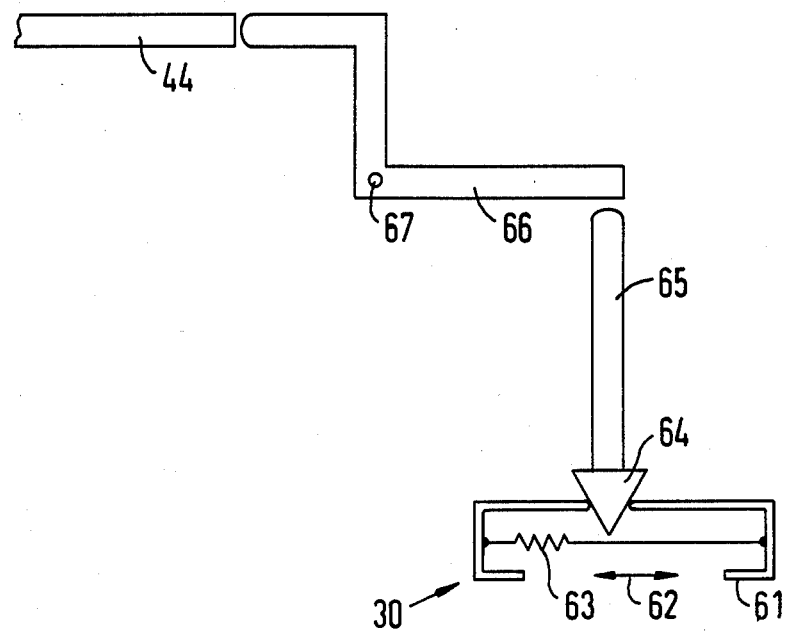

The mechanism provided for actuating the opening and closing mechanism of the pliers 30 is shown diagrammatically in FIG. 5. The opening push rod 44 actuated by the cam 15 and the lever 9, in the same way as is done in FIG. 3, acts on a pin 65 through a transmission lever 66 having a fulcrum 67, in such a manner that a longitudinal movement of the opening push rod 44 corresponds to a movement in the height of the pin 65. The pin 65 is rigidly connected to a cone 64 which can be moved between plier jaws 61 of the pliers 30, and the jaws can be pressed together by means of a spring 63, so that the pliers are opened upon a downward movement of the cone 64, while upon an upward movement of the cone 64 the plier jaws are closed by means of the spring 63.

The same applies to the actuation of the pliers 31 of the removal head 5.

Figure 6:
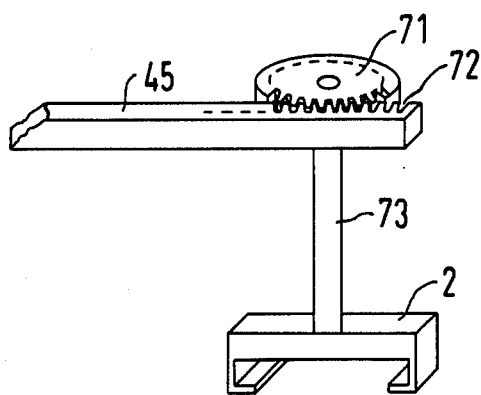

Since the placement of the measuring socket 33 on the measuring card 70 is not fixed but, according to the construction of the measuring card made for a specific component, may lie in the longitudinal or transverse direction, it is necessary to optionally rotate the heads 2 and 5, such as through 90°, about their axis (the axis 34 for the inserting head 2). An embodiment example of a mechanical device required for this purpose is shown in FIG. 6. The plier-rotating push rod 45 is displaced longitudinally in the manner similar to FIG. 3 by a cam 16 and a lever 10. At its end facing the inserting head 2, the plier push rod 45 has a rack of teeth 72 which rotate a gear 71 in the event of a longitudinal displacement of the rod 45. The shaft of the gear 71 is constructed as a key sleeve 73 and is connected to the inserting head 2 in such a manner that a longitudinal movement of the rod 45 corresponds to a rotation of the inserting head 2 about the axis of the key shaft 73.

The same applies to the construction of the mechanism for rotating the removal head 5.

Figure 7:
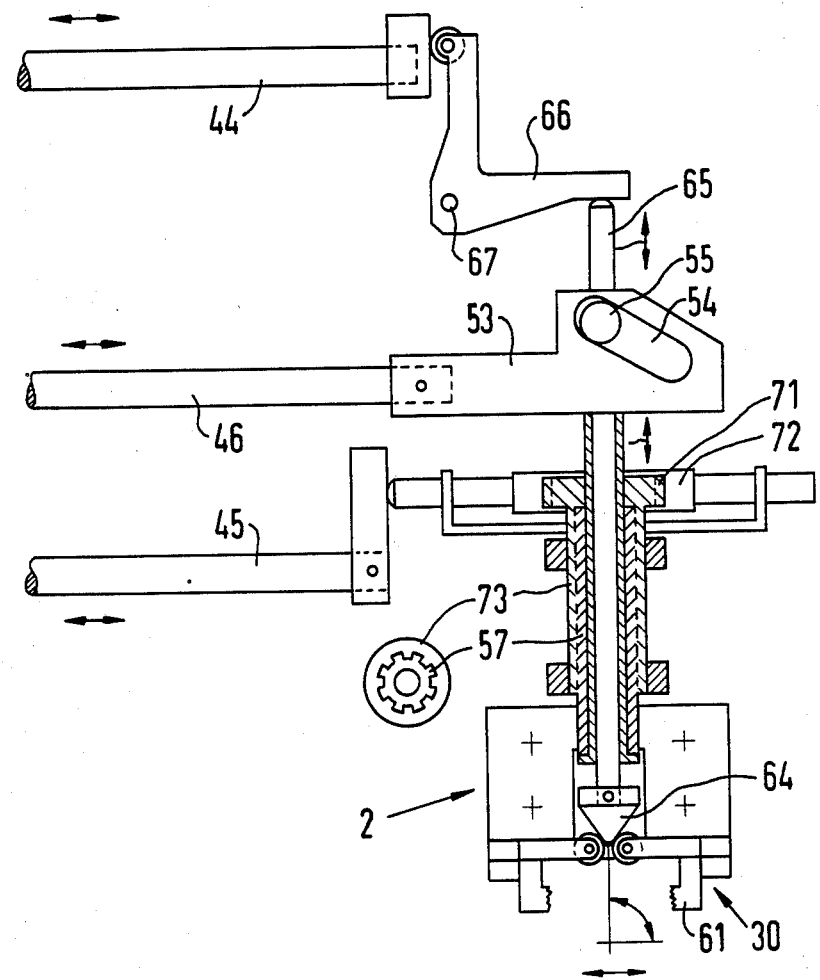

An example for the interaction of the motion mechanisms shown in FIGS. 4, 5 and 6 is shown in FIG. 7, where the same reference symbols are used as in FIGS. 1 to 6.

Figure 8:
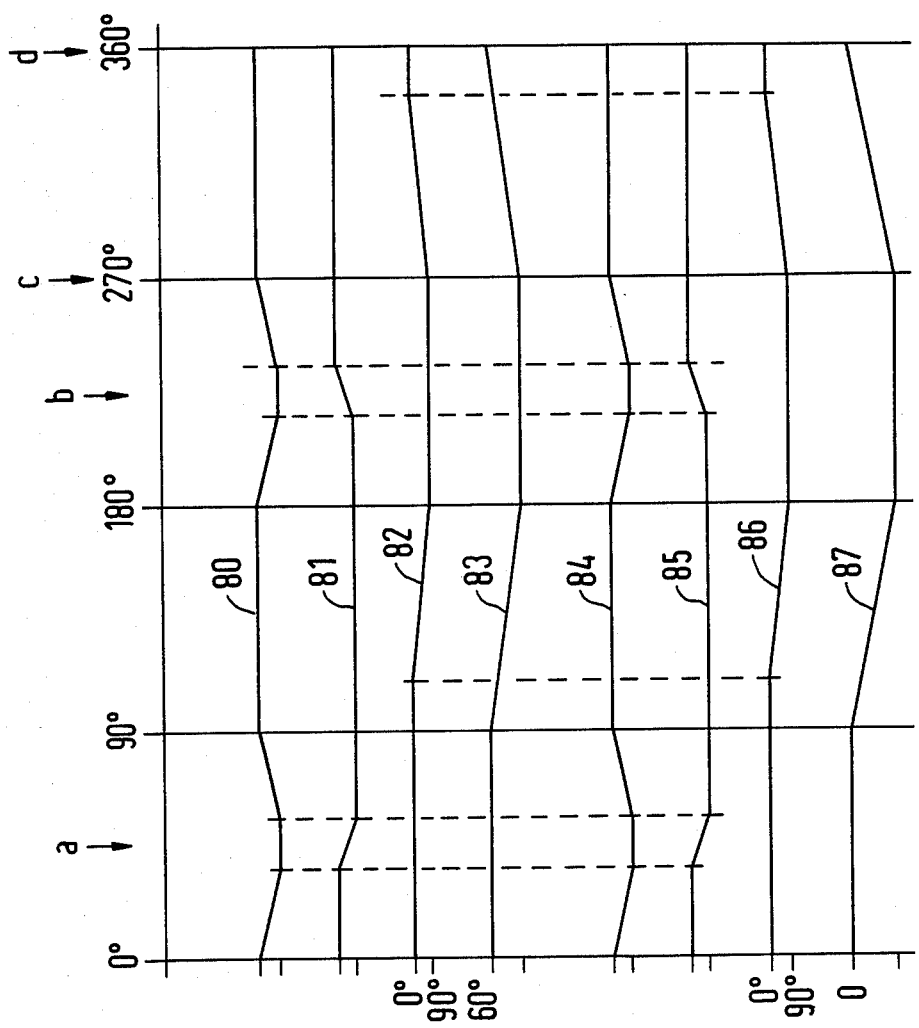
FIG. 8 is a timing diagram for operating the automatic machine according to the invention.

FIG. 8 shows the timing diagram for the cam cycle and the insertion and removal movement during a 360° revolution of the shaft 26. The curves 80 to 83 relate to movements of the inserting head 2, while the curves 84 to 87 represent movements of the removal head 5. The curve 80 shows the height displacement of the head 2 or the pliers 30 caused by the height displacement cam 14, with the extreme positions "top" and "bottom". The curve 81 shows the state of the pliers 30 controlled by the opening cam 15 with the extreme positions "open" and "closed". The rotary movement of the pliers 30 about the axis 34 with the extreme positions 0° and 90°, controlled by the plier-rotation cam 16, is shown by curve 82. The swing motion of the head 2, through 60°, for example, controlled by the cam 50 with the extreme values 60° (toward the supply container 31) and "vertical" is shown by the curve 83.

Similarly, for the removal head 5 and the pliers 37, respectively, the curve 84 indicates the lifting motion of the head 5 which is controlled by the cam 18; the curve 85 indicates the opening of the pliers which is controlled by the cam 19; and the curve 86 represents the 90° rotation of the pliers 37 which is controlled by the cam 20. The shifting of the head 5 (in the arrow direction 22) controlled by the cam 24 is indicated by the curve 87.

It will be seen that approximately at the angle or time "a", a component 32 is grabbed by the pliers 30 from the supply container 31 and is inserted approximately at the time "b" into the measuring socket 33. Simultaneously, approximately at the time "a", an already tested component 32 is grabbed by the removal head 2 from the measuring socket 33 and deposited approximately at the time "b" on the sorting track 35. The measurement itself can begin at the time "c" and can last, for instance, up to the time "d". The individual instants can be controlled exactly by appropriate cam construction.

Due to the simultaneous operation of the insertion head 2 and the removal head 5, the time required for a cycle (360°) is cut in half as compared to separately operating heads. By the sinusoidal control of the motions, which is possible by means of the shaping of the cams, easy running of the machine and gentle handling of the components is achieved. The fact that the motor 27, which may be provided as an electric or a hydraulic motor, can continue to run at constant speed, so that the automatic machine according to the invention has a longer life as compared to pneumatically operated equipments, contributes further to the protection of the material. While only cycle times of 2 to 3 seconds can as a rule be attained with pneumatic equipment, the automatic machine according to the invention works with a trouble-free cycle time of 0.9 seconds in continuous operation. As compared to manually operated measuring stations, it was possible to improve the throughput as well as the output quality by a factor of 3. Due to the compact construction, the automatic device according to the invention can be put on any manual measuring station without the need for electrical or mechanical intervention into an already existing manual measuring station. This makes it possible to keep the line length between the measuring card 70 and the test equipment small and thus to test components with extremely short access times.

The foregoing is a description corresponding to German Application P No. 31 19 686.1, dated May 18, 1981, the International priority of which is being claimed for the instant application, and which is hereby made part of this application. Any discrepancies between the foregoing specification and the aforementioned corresponding German application are to be resolved in favor of the latter.

I claim:

1. Automatic insertion and removal device for components, comprising a supply container for the components, a holding device for the components, an insertion head for taking the components from said supply container and inserting the components into said holding device, a removal head for removing the components from the holding device and for passing the components on, and a cam control connected to said heads for providing a motion cycle for said heads, said cam control including opening cams, opening levers being actuatable by said opening cams and opening push rods being actuatable by said opening levers, and each of said heads including pliers facing a component, said pliers being actuatable by said opening push rods for gripping the component.

2. Automatic insertion and removal device according to claim 1, wherein said pliers for gripping the components each include two plier jaws, a spring connected to said jaws for urging said jaws together, a cone being insertable between said jaws for pushing said jaws apart, and a transmission lever being actuatable by said opening push rod for pushing said cone between said jaws.

3. Automatic insertion and removal device for components, comprising a supply container for the components, a holding device for the components, an insertion head for taking the components from said supply container and inserting the components into said holding device, a removal head for removing the components from the holding device and for passing the components on, and a cam control connected to said heads for providing a motion cycle for said heads, said heads including pliers facing a component for gripping the component, and said cam control including height-positioning cams, height-positioning levers being actuatable by said height-positioning cams and height-positioning push rods being actuatable by said height-positioning levers for adjusting said pliers in height relative to said holding device.

4. Automatic insertion and removal device according to claim 3, wherein said holding device is disposed in a given plane, and said cam control includes plier-rotating cams, plier-rotating levers being actuatable by said plier-rotating cams and plier-rotating push rods being actuatable by said plier-rotating levers for rotating said pliers at least in said given plane.

5. Automatic insertion and removal device according to claim 3, including a plate having a coulisse and being connected to said pliers, said height-positioning push rods being engageable with said coulisse.

6. Automatic insertion and removal device according to claim 3, including a key shaft connected between said pliers and a coulisse engageable by said height-positioning push rod.

7. Automatic insertion and removal device according to claim 5, including a key shaft connected between said pliers and said coulisse engageable by said height-positioning push rod.

8. Automatic insertion and removal device for components, comprising a supply container for the components, a holding device for the components, an insertion head for taking the components from said supply container and inserting the components into said holding device, a removal head for removing the components from the holding device and for passing the components on, and a cam control connected to said heads for providing a motion cycle for said heads, said heads including pliers facing a component for gripping the component, said holding device being disposed in a given plane, and said cam control including plier-rotating cams, plier-rotating levers being actuatable by said plier-rotating cams and plier-rotating push rods being actuatable by said plier-rotating levers for rotating said pliers at least in said given plane.

9. Automatic insertion and removal device according to claim 8, wherein said pliers are rotatable in a plane perpendicular to said given plane in which said holding device is disposed.

10. Automatic insertion and removal device according to claim 8, wherein said pliers are movable in a plane parallel to said given plane in which said holding device is disposed.

11. Automatic insertion and removal device according to claim 8, wherein said plier-rotating push rod has a rack formed in a side thereof, and including at least one key shaft connected to at least one of said heads and a gear connected to said key shaft, said gear being rotatable by said rack.

* * * * *